United States Patent
Jang et al.

(10) Patent No.: US 8,130,510 B2
(45) Date of Patent: Mar. 6, 2012

(54) PRINTED CIRCUIT BOARD ASSEMBLY OF ELECTRONIC APPLIANCE

(75) Inventors: Sang Wook Jang, Suwon-si (KR); Matsumoto Satoru, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 340 days.

(21) Appl. No.: 12/453,119

(22) Filed: Apr. 29, 2009

(65) Prior Publication Data

US 2010/0122841 A1 May 20, 2010

(30) Foreign Application Priority Data

Nov. 14, 2008 (KR) .................. 10-2008-0113103

(51) Int. Cl.
  *D06F 33/00* (2006.01)
  *D06B 1/00* (2006.01)
  *D06F 33/02* (2006.01)

(52) U.S. Cl. .............. 361/784; 361/679.01; 361/785; 361/782; 68/12.02; 68/12.04; 68/12.06; 68/12.16; 68/139; 8/158; 8/159; 8/137; 236/12.1; 236/12.12; 134/56 R; 134/94.1; 134/96.1

(58) Field of Classification Search ........... 361/679.01, 361/727, 717–724, 748, 752, 760–767, 784, 361/785, 788, 89, 790, 792; 700/11, 12, 700/19, 83; 710/64, 207, 301, 302, 313; 68/12.06, 12.12, 12.23, 24, 12.21, 12.22, 68/12.07, 139, 12.04, 12.27, 12.16; 340/337, 340/365 G; 134/56 D, 57 D, 56 R, 19.8, 134/94.1, 96.1, 102.3, 198; 236/12.1, 12.12; 8/137, 158, 159
See application file for complete search history.

(56) References Cited

U.S. PATENT DOCUMENTS

| | | | | |
|---|---|---|---|---|
| 4,380,698 A | * | 4/1983 | Butts ............................. | 219/492 |
| 4,431,907 A | * | 2/1984 | Barnett .................... | 219/448.11 |
| 4,979,075 A | * | 12/1990 | Murphy .................... | 361/679.32 |
| 5,274,765 A | * | 12/1993 | Le Gallo ......................... | 710/64 |
| 5,604,871 A | * | 2/1997 | Pecone ......................... | 710/301 |
| 6,328,598 B1 | * | 12/2001 | Harris, Jr. ..................... | 439/516 |
| 6,662,104 B2 | * | 12/2003 | Ito et al. ........................ | 701/207 |
| 6,820,156 B1 | * | 11/2004 | Miller et al. ................... | 710/301 |
| 6,865,682 B1 | * | 3/2005 | Talbot et al. .................. | 713/300 |
| 7,149,836 B2 | * | 12/2006 | Yu et al. ........................ | 710/301 |
| 7,359,216 B2 | * | 4/2008 | Hall .............................. | 361/796 |
| 2009/0140769 A1 | * | 6/2009 | Suzuki et al. .................. | 326/80 |
| 2009/0251867 A1 | * | 10/2009 | Sharma et al. ................ | 361/737 |

FOREIGN PATENT DOCUMENTS

| | | | | |
|---|---|---|---|---|
| JP | 402142526 A | * | 5/1990 | |
| JP | 404051916 A | * | 2/1992 | |
| JP | 406154476 A | * | 6/1994 | |
| JP | 408064974 A | * | 3/1996 | |
| KR | 10-2001-0032060 | | 4/2001 | |
| KR | 10-2005-0115627 | | 12/2005 | |

* cited by examiner

*Primary Examiner* — Michail V Datskovskiy
(74) *Attorney, Agent, or Firm* — Staas & Halsey LLP

(57) ABSTRACT

Disclosed herein is a printed circuit board assembly of an electronic appliance including a plurality of boards on which electrical parts to perform functions necessary for the electronic appliance are separately arranged according to the specification of the electronic appliance. The printed circuit board assembly is divided into a plurality of boards, such that electrical parts having a common specification and electrical parts having different specifications are arranged on different boards, thereby optimizing the printed circuit board assembly and configuring the boards according to the specification of the electronic appliance without loss. Microprocessors are arranged on the boards, and the boards are connected to each other in a serial communication, thereby reducing the number of wiring harnesses (W/H) and thus configuring the printed circuit board assembly with high reliability. Furthermore, the boards are connected to each other in an insulation manner, thereby configuring the boards in an anti-resistance structure.

7 Claims, 5 Drawing Sheets

PRINTED CIRCUIT BOARD ASSEMBLY OF ELECTRONIC APPLIANCE

CROSS-REFERENCE TO RELATED APPLICATIONS

This application claims the priority benefit of Korean Patent Application No. 2008-0113103, filed on Nov. 14, 2008 in the Korean Intellectual Property Office, the disclosure of which is incorporated herein by reference.

BACKGROUND

1. Field

Embodiments relate to a printed circuit board assembly of an electronic appliance, and, more particularly, to a printed circuit board assembly of an electronic appliance including a plurality of boards on which electrical parts to perform functions necessary for the electronic appliance are separately arranged according to the specification of the electronic appliance.

2. Description of the Related Art

Generally, an electronic appliance (for example, a washing machine) includes a power supply unit to supply power, a drive unit to drive a motor, a signal processing unit to process various signals, a sensor unit, and a display unit, to perform functions necessary to operate the electronic appliance.

In recent years, the performance of electronic appliances has been gradually improved to provide more convenience for users and a higher quality. of Accordingly, various functions (for example, a drying function, a nano silver function, etc., for a washing machine) have been added to the electronic appliances. To perform various functions necessary for an electronic appliance, therefore, it is required to arrange electrical parts (for example, a power supply unit and a drive unit) to be commonly mounted irrespective of the specification of the electronic appliance (specifically, the kind or model of a washing machine). In addition, it is required that electrical parts (for example, a fan motor used to perform drying, a sensor unit added according to the addition of functions, a display unit modified according to the addition of functions, etc.) be differently mounted on a printed circuit board according to the specification of the electronic appliance.

In the past, not only the electrical parts to be commonly mounted irrespective of the specification of the electronic appliance but also the electrical parts to be differently mounted according to the specification of the electronic appliance were arranged on a single printed circuit board. As a result, the size of the printed circuit board increases, whereby it is difficult to install the printed circuit board in the electronic appliance. Also, a reference point (i.e., ground) of electrical parts having a strong electric field and electrical parts having a weak electric field are commonly designed in the single printed circuit board. As a result, the electronic appliance is delicate to noise generated by the interference between the strong electric field and the weak electric field of the electrical parts, and the overall reliability of the electronic appliance is deteriorated due to the noise.

SUMMARY

Therefore, it is an aspect of an exemplary embodiment to provide a printed circuit board assembly of an electronic appliance, including a plurality of boards, wherein electrical parts having a common specification of the electronic appliance and electrical parts having different specifications of the electronic appliance are separately arranged on the boards, thereby configuring the boards according to the specification of the electronic appliance without loss while reducing the sizes of the boards.

It is another aspect of an exemplary embodiment to provide a printed circuit board assembly of an electronic appliance, wherein microprocessors are arranged on a plurality of boards such that the boards are connected to each other in a serial communication, thereby reducing the number of wiring harnesses (W/H) and thus configuring the boards with high reliability.

In accordance with one aspect of an exemplary embodiment, there is provided a printed circuit board assembly of an electronic appliance, including a plurality of boards, wherein electrical parts having a common specification of the electronic appliance and electrical parts having different specifications of the electronic appliance are separately arranged on the boards.

The printed circuit board assembly may further include microprocessors arranged on the respective boards such that the boards are connected to each other in a serial communication.

The printed circuit board assembly may further include an insulation unit disposed between the boards to interconnect the boards and to insulate the boards containing the electrical parts from electric fields and vibrations.

The boards may include a first board on which the electrical parts having the common specification of the electronic appliance are arranged and a second board on which the electrical parts having the different specifications of the electronic appliance are arranged.

Also, the printed circuit board assembly may further include a third board on which an electrical part modified according to the specification of the electronic device is arranged.

The second board may be configured to allow an electrical part modified according to the specification of the electronic device to be also arranged thereon.

The electrical parts having the common specification of the electronic appliance may be electric parts commonly mounted irrespective of the specification of the electronic appliance.

The electric parts commonly mounted irrespective of the specification of the electronic appliance may include a power supply unit or a drive unit.

The electrical parts having the different specifications of the electronic appliance may be electric parts differently mounted according to the specification of the electronic appliance.

The electric parts differently mounted according to the specification of the electronic appliance may include at least one of signal processing unit, a sensor unit, and a display unit.

The electronic appliance may include one of a washing machine and a dish washer.

The specification of the electronic appliance may be model of the washing machine.

In accordance with another of an exemplary embodiment, there is provided a printed circuit board assembly of an electronic appliance, including a first board connected to a power source line such that the first board is independently driven and a second board configured to be driven through a communication with the first board, wherein electrical parts having a common specification of the electronic appliance and electrical parts having different specifications of the electronic appliance are separately arranged on the first and second boards.

The printed circuit board assembly may further include microprocessors arranged on the first and second boards such that the first and second boards are connected to each other in a serial communication.

The printed circuit board assembly may further include an insulation unit to interconnect the first and second boards and to insulate the boards containing the electrical parts from electric fields and vibrations.

In accordance with another of an exemplary embodiment, there is provided a printed circuit board assembly of a washing machine, including a plurality of boards, wherein electrical parts having a common specification of the washing machine and electrical parts having different specifications of the washing machine are separately arranged on the boards.

The specification of the washing machine may include at least one of a steam, nano silver, and drying function.

In accordance with a further aspect of an exemplary embodiment, there is provided a printed circuit board assembly of an electronic appliance, including a first board on which electrical parts having a common specification of the electronic appliance are arranged and a second board on which electrical parts having different specifications of the electronic appliance are arranged, wherein the first and second boards are separately disposed on different planes.

BRIEF DESCRIPTION OF THE DRAWINGS

These and/or other aspects of exemplary embodiments will become apparent and more readily appreciated from the following description of exemplary embodiments, taken in conjunction with the accompanying drawings, of which.

DETAILED DESCRIPTION

Figure 1:
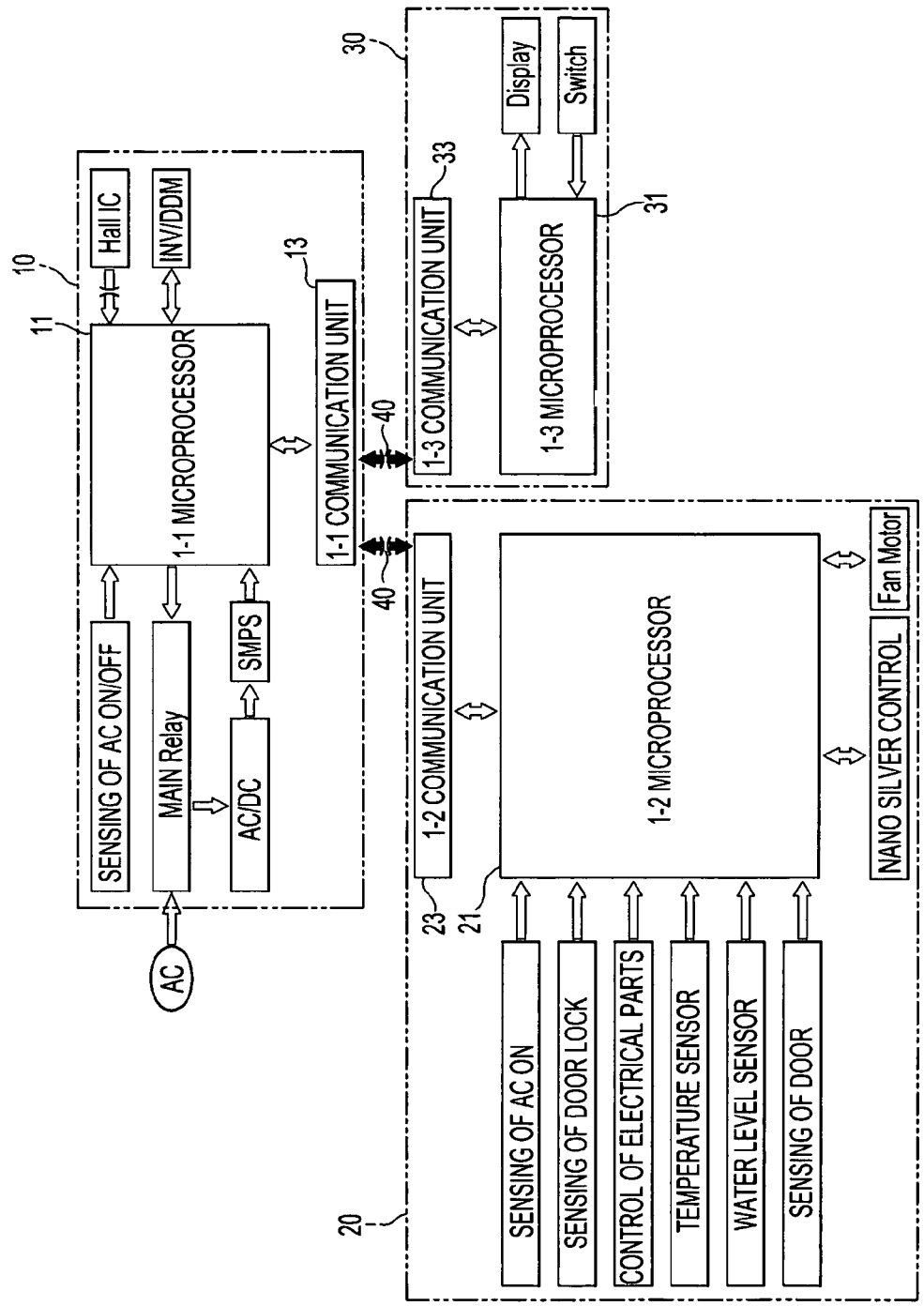
FIG. 1 is a constructional view of a printed circuit board assembly of an electronic appliance according to an exemplary embodiment.

Reference will now be made in detail to exemplary embodiments, examples of which are illustrated in the accompanying drawings, wherein like reference numerals refer to like elements throughout. Exemplary embodiments are described below by referring to the figures.

FIG. 1 is a constructional view of a printed circuit board assembly of an electronic appliance according to an exemplary embodiment.

Referring to FIG. 1, the printed circuit board assembly includes a 1-1 board 10 on which electrical parts (for example, a power supply unit and a drive unit) to be commonly mounted irrespective of the specification of an electronic appliance (specifically, the kind or model of a washing machine) are arranged, a 1-2 board 20 on which electrical parts (for example, a fan motor used to perform drying, a heater used to generate steam, a sensor unit added according to the specification of the electronic appliance, etc., for a washing machine) to be differently mounted according to the specification of the electronic appliance are arranged, and a 1-3 board 30 on which an electrical part (for example, a display unit modified according to the specification of the electronic appliance) to be modified according to the specification of the electronic appliance is arranged.

On the 1-1 to 1-3 boards 10, 20, and 30 are arranged 1-1 to 1-3 microprocessors 11, 21, and 31 to control the operations of the boards 10, 20, and 30 and 1-1 to 1-3 communication units 13, 23, and 33 to transmit and receive data among the boards 10, 20, and 30 in a serial communication, respectively.

Between the 1-1 board 10 and the 1-2 board 20 and between the 1-1 board 10 and the 1-3 board 30 are provided insulation units (insulation circuits) 40 to interconnect the 1-1 communication unit 13 and the 1-2 communication unit 23 and interconnect the 1-1 communication unit 13 and the 1-3 communication unit 33 in an insulation manner to achieve the insulation between the boards 10 and 20 and between the boards 10 and 30, respectively.

The insulation units 40 stably keep the insulation between the 1-1 board 10 and the 1-2 board 20 and between the 1-1 board 10 and the 1-3 board 30 from vibrations generated by the operation of the electronic appliance (especially, vibrations generated during the performance of an operation for a washing machine), thereby preventing the occurrence of a fire or the damage to the boards 10, 20, and 30 even after using the electronic appliance for a long time or even when the friction among wires occurs.

When an AC power from an AC power source is supplied to an electronic appliance including the printed circuit board assembly according to this exemplary embodiment as shown in FIG. 1, a main relay of the 1-1 board 10 connected to a power line of the AC power source is operated, and the AC power passes through an AC/DC converter and a switching mode power supply (SMPS), with the result that a DC operation voltage is supplied to the 1-1 microprocessor 11.

When the DC operation voltage is supplied to the 1-1 microprocessor 11, the 1-1 microprocessor 11 is connected to the 1-2 and 1-3 communication units 23 and 33 of the 1-2 and 1-3 boards 20 and 30 in a serial communication through the 1-1 communication unit 13 to start the transmission and reception of data to and from the 1-2 and 1-3 microprocessors 21 and 31, thereby performing a function necessary to operate the electronic appliance.

At this time, the 1-1 microprocessor 11 controls an inverter (INV) related to the driving of a direct drive motor (DDM), which is an electrical part commonly mounted irrespective of the specification of the electronic appliance, the 1-2 microprocessor 21 controls a fan motor, a nano silver controller, and various sensors, which are electrical parts differently mounted according to the specification of the electronic appliance, and the 1-3 microprocessor 31 controls a display unit, which is an electrical part modified according to the specification of the electronic appliance.

When the printed circuit board assembly mounted in the electronic appliance is divided into the 1-1 to 1-3 boards 10, 20, and 30, it is possible to optimize the printed circuit board assembly, thereby configuring the boards 10, 20, and 30 according to the specification of the electronic appliance without loss while reducing the sizes of the boards 10, 20, and 30.

Also, the insulation units 40 are provided between the 1-1 board 10 and the 1-2 board 20 and between the 1-1 board 10 and the 1-3 board 30 to separate a strong electric field and a weak electric field from each other, whereby it is possible to configure the boards 10, 20, and 30 in an anti-resistance structure.

Figure 2:
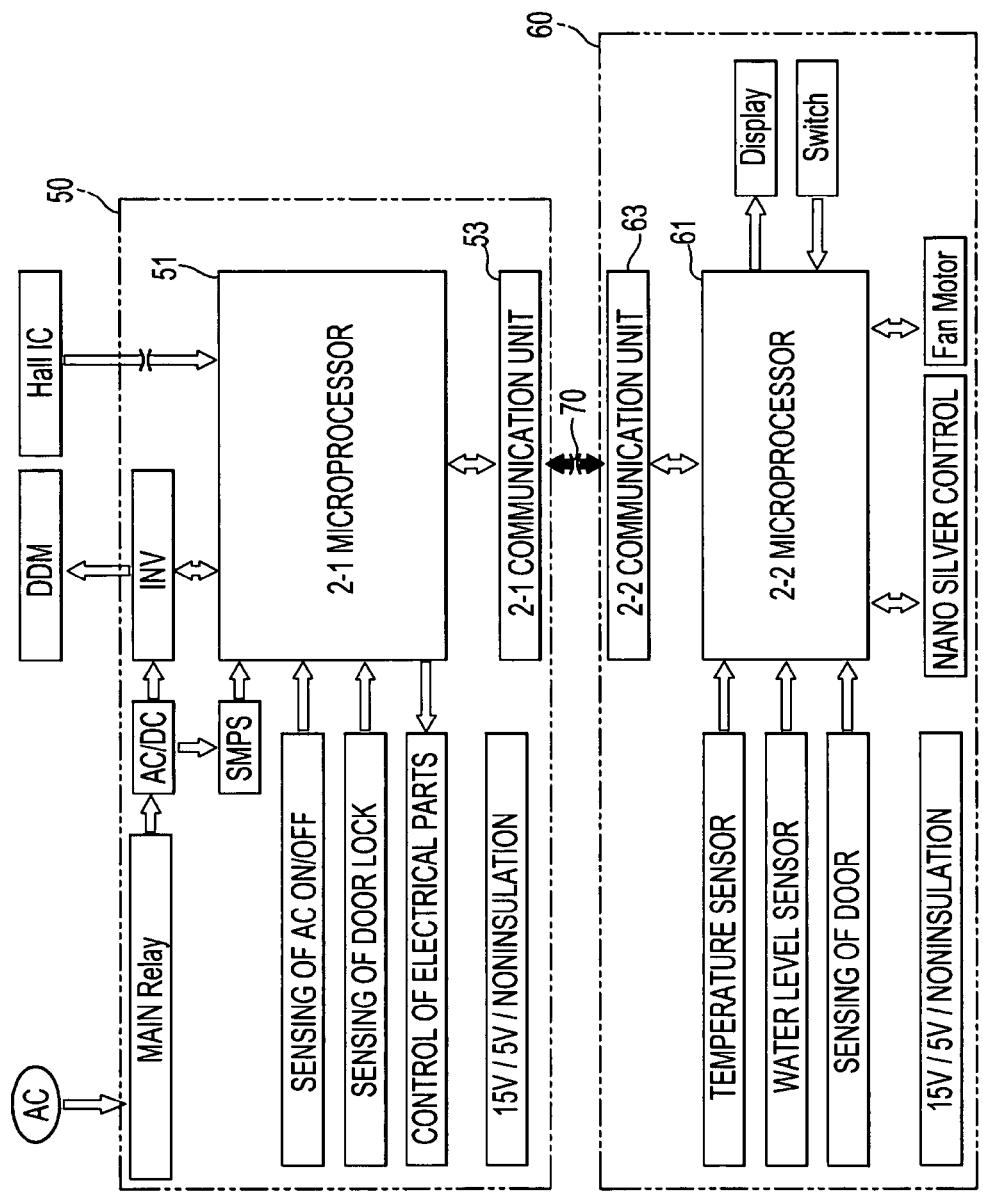
FIG. 2 is a constructional view of a printed circuit board assembly of an electronic appliance according to another exemplary embodiment.

FIG. 2 is a constructional view of a printed circuit board assembly of an electronic appliance according to another exemplary embodiment.

Referring to FIG. 2, the printed circuit board assembly includes a 2-1 board 50 on which electrical parts (for example, a power supply unit and a drive unit) to be commonly mounted irrespective of the specification of an electronic appliance (specifically, the kind or model of a washing machine) are arranged and a 2-2 board 60 on which electrical parts (for example, a fan motor used to perform drying, a heater used to generate steam, a sensor unit added according to the addition of functions, a display unit modified according to the addition of functions, etc.) to be differently mounted according to the specification of the electronic appliance are arranged.

On the 2-1 and 2-2 boards 50 and 60 are arranged 2-1 and 2-2 microprocessors 51 and 61 to control the operations of the boards 50 and 60 and 2-1 to 2-2 communication units 53 and 63 to transmit and receive data between the boards 50 and 60 in a serial communication, respectively.

Between the 2-1 and 2-2 boards 50 and 60 is provided an insulation unit (an insulation circuit) 70 to interconnect the 2-1 and 2-2 communication units 53 and 63 in an insulation manner to achieve the insulation between the boards 50 and 60.

The insulation unit 70 stably keeps the insulation between the 2-1 board 50 and the 2-2 board 60 from vibrations generated by the operation of the electronic appliance (especially, vibrations generated during the performance of an operation for a washing machine), thereby preventing the occurrence of a fire or the damage to the boards 50 and 60 even after using the electronic appliance for a long time or even when the friction among wires occurs.

In this exemplary embodiment, not only the electrical parts to be differently mounted according to the specification of the electronic appliance but also the electrical part (the display unit) to be modified according to the specification of the electronic appliance is arranged on the 2-2 board 60.

Figure 3:
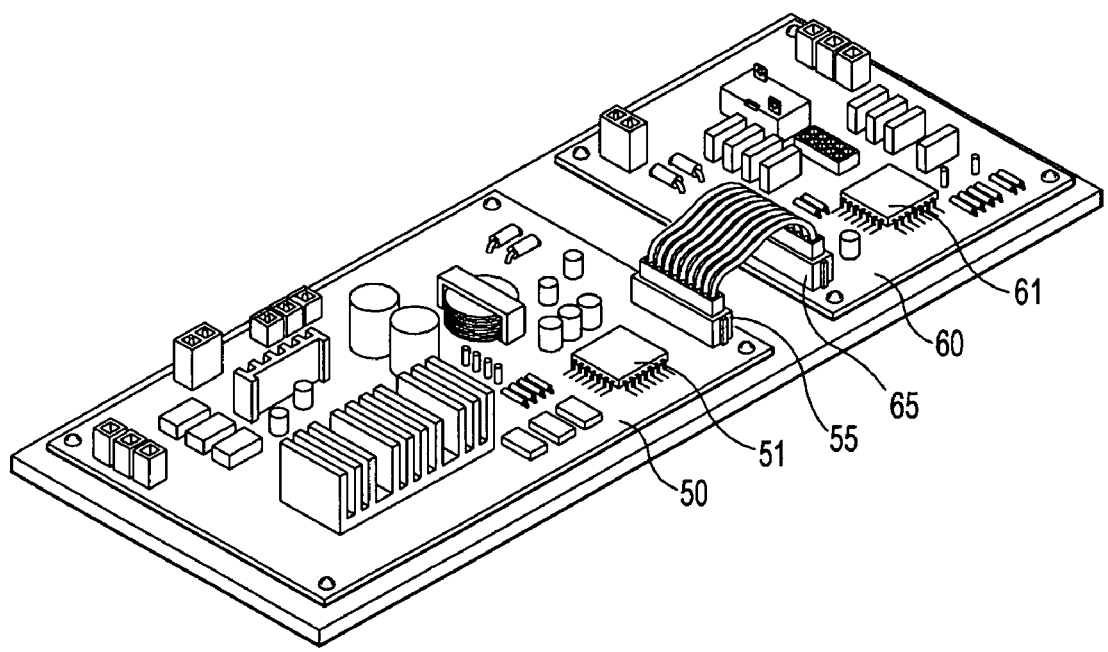
FIG. 3 is a first exploded perspective view of the printed circuit board assembly according to the another exemplary embodiment.

FIG. 3 is a first exploded perspective view of the printed circuit board assembly according to another exemplary embodiment. The same elements of FIG. 3 as those of FIG. 2 are denoted by the same names and the same reference numerals, and a duplicated description thereof will not be given.

Referring to FIG. 3, the printed circuit board assembly is divided into the 2-1 board 50, on which electrical parts having a common specification are arranged, and the 2-2 board 60, on which electrical parts having different specifications are arranged.

The 2-1 board 50 has a 2-1 connector 55 electrically connected to the 2-2 board 60. The 2-2 board 60 has a 2-2 connector 65 electrically connected to the 2-1 board 50. Consequently, the 2-1 board 50 and the 2-2 board 60 are electrically connected to each other by the connection between the 2-1 connector 55 and the 2-2 connector 65 to perform the supply of power, grounding, and data transmission.

When an AC power from an AC power source is supplied to an electronic appliance including the printed circuit board assembly according to this exemplary embodiment as shown in FIGS. 2 and 3, a main relay of the 2-1 board 50 connected to a power line of the AC power source is operated, and the AC power passes through an AC/DC converter and an SMPS, with the result that a DC operation voltage is supplied to the 2-1 microprocessor 51.

When the DC operation voltage is supplied to the 2-1 microprocessor 51, the 2-1 microprocessor 51 is connected to the 2-2 communication unit 63 of the 2-2 board 60 in a serial communication through the 2-1 communication unit 53 to start the transmission and reception of data to and from the 2-2 microprocessors 61, thereby performing a function necessary to operate the electronic appliance.

At this time, the 2-1 microprocessor 51 controls an inverter (INV) related to the driving of a direct drive motor (DDM), which is an electrical part commonly mounted irrespective of the specification of the electronic appliance. The 2-2 microprocessor 61 controls a fan motor, a nano silver controller, and various sensors, which are electrical parts differently mounted according to the specification of the electronic appliance, and controls a display unit, which is an electrical part modified according to the specification of the electronic appliance.

When the printed circuit board assembly mounted in the electronic appliance is divided into the 2-1 and 2-2 boards 50 and 60, it is possible to optimize the printed circuit board assembly, thereby configuring the boards 50 and 60 according to the specification of the electronic appliance without loss while reducing the sizes of the boards 50 and 60.

Also, the insulation unit 70 is provided between the 2-1 board 50 and the 2-2 board 60 to separate a strong electric field and a weak electric field from each other, whereby it is possible to configure the boards 50 and 60 in an anti-resistance structure.

Figure 4:
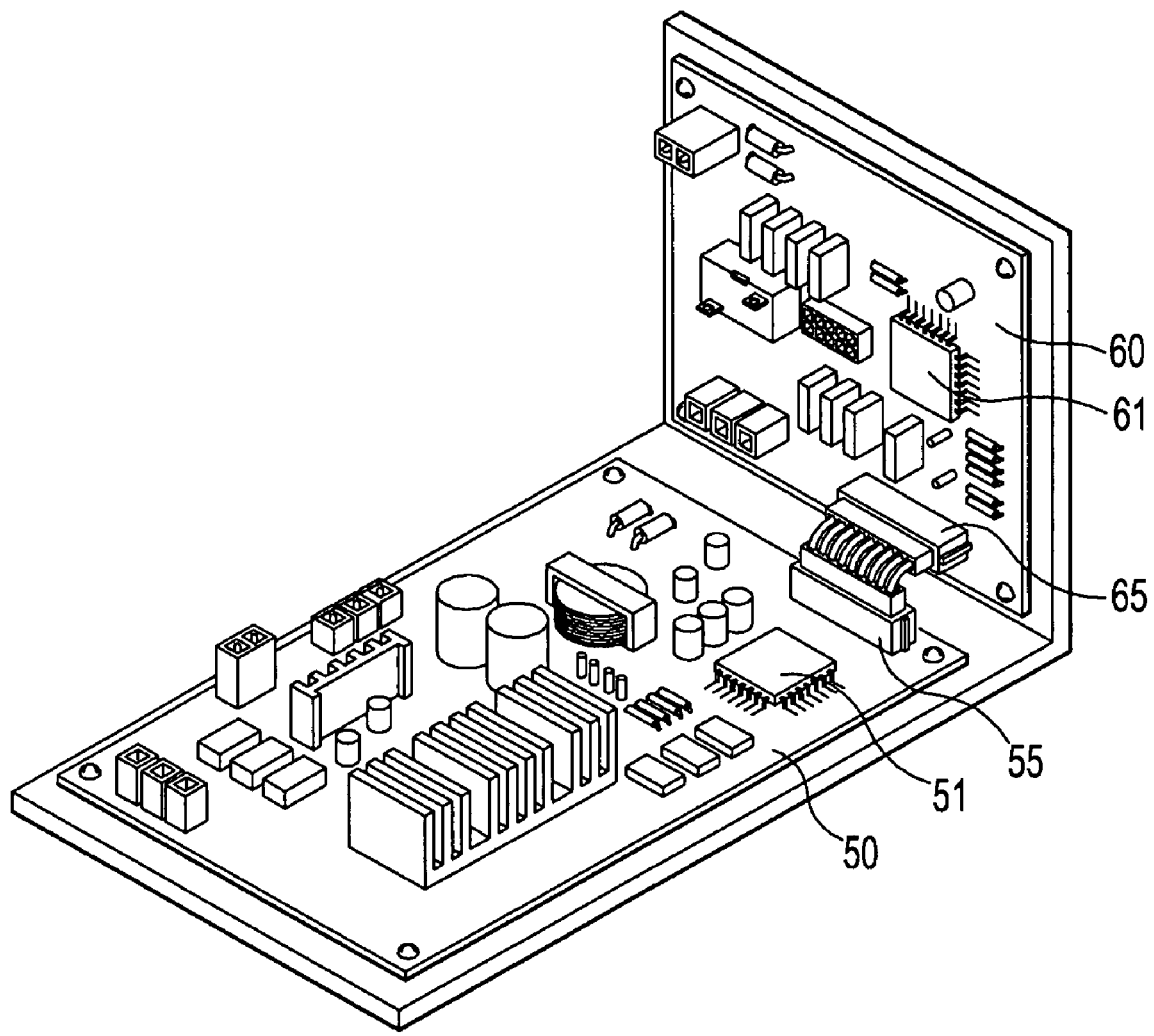
FIG. 4 is a second exploded perspective view of the printed circuit board assembly according to another exemplary embodiment.
Figure 5:
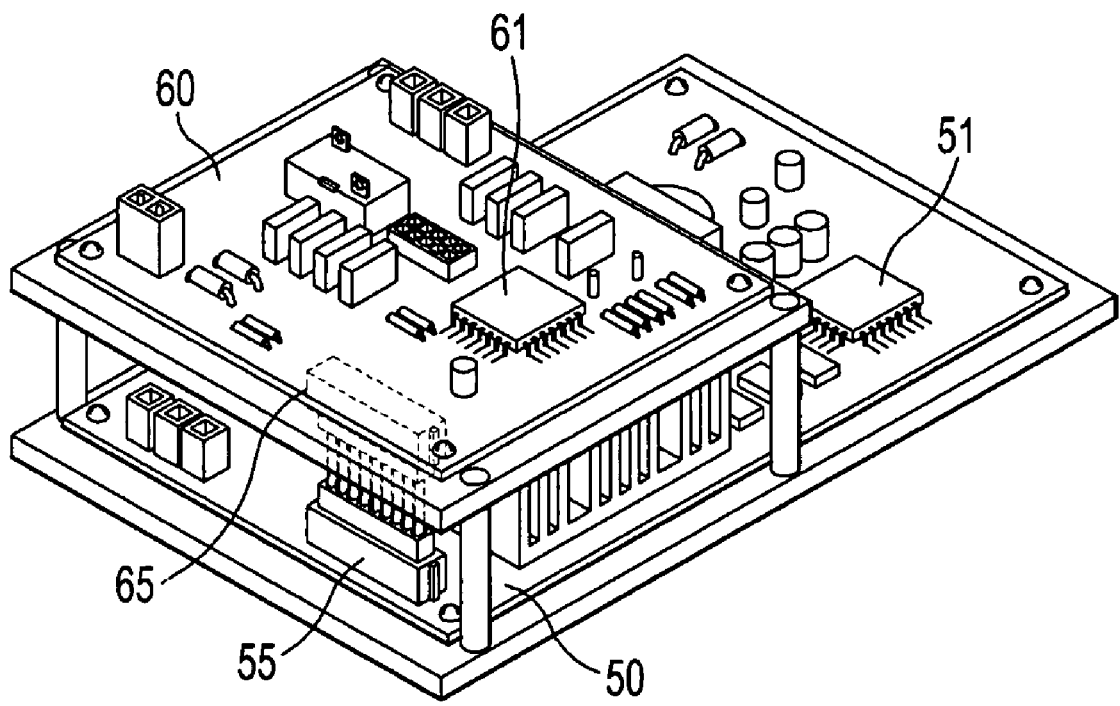
FIG. 5 is a third exploded perspective view of the printed circuit board assembly according to another exemplary embodiment.

FIGS. 4 and 5 are other exploded perspective views of the printed circuit board assembly according to another exemplary embodiment.

Referring to FIGS. 4 and 5, the 2-1 board 50, on which electrical parts having a common specification are arranged, and the 2-2 board 60, on which electrical parts having different specifications are arranged, constituting the printed circuit board assembly, may be disposed on different planes. The structure in which the boards 50 and 60 are disposed in the shape of an "L" as shown in FIG. 4 or the structure in which the boards 50 and 60 are disposed in a multilayered structure as shown in FIG. 5 minimizes a space occupied by the boards 50 and 60 in the electronic appliance and allows the boards 50 and 60 to be disposed in any spatial shape. The "L" shaped structure shown in FIG. 4 may be rotated 90°, 180°, or 270°, for example.

In previous exemplary embodiments, the washing machine was illustrated and described as an example of the electronic appliance. However, exemplary embodiments are not limited to the washing machine but may be applicable to any other electronic appliance, such as a dish washer or a cooker, having the printed circuit board assembly mounted therein.

As apparent from the above description, the printed circuit board assembly of the electronic appliance is divided into a plurality of boards according to exemplary embodiments, such that electrical parts having a common specification and electrical parts having different specifications are arranged on different boards. Consequently, it is possible to optimize the printed circuit board assembly, thereby configuring the boards according to the specification of the electronic appliance without loss while reducing the sizes of the board.

Also, the microprocessors are arranged on the corresponding boards, and the boards are connected to each other in a serial communication. Consequently, the number of wiring harnesses (W/H) is reduced, whereby it is possible to configure the boards with high reliability. Furthermore, the boards are connected to each other in an insulation manner, whereby it is possible to configure the printed circuit board assembly in an anti-resistance structure.

Although a few exemplary embodiments have been shown and described, it would be appreciated by those skilled in the art that changes may be made in these exemplary embodiments without departing from the principles and spirit of the disclosure, the scope of which is defined in the claims and their equivalents.

What is claimed is:

1. A printed circuit board assembly of a washing machine, comprising at least three boards, wherein
   the at least three boards comprise:
   a first board having a first microprocessor to control cycles of the washing machine;
   a second board having a second microprocessor to control electrical parts of the washing machine; and
   a third board having a third microprocessor to control display of the washing machine,
   the first, second and third boards are provided with first, second and third communication units, respectively, through which data are transmitted and received between the first and second microprocessors and between the first and third microprocessors,
   the second microprocessor is receiving a command from the first microprocessor through the first and second communication units, and
   the third microprocessor is receiving a command from the first microprocessor through the first and third communication units.

2. The printed circuit board assembly according to claim 1, further comprising:
   an inverter to control a motor of the washing machine, wherein
   the inverter is disposed at the first board.

3. The printed circuit board assembly according to claim 1, wherein
   the electrical parts comprise a heater, a fan motor and a sensor, which are differently mounted based on a function of the washing machine, and
   the electrical parts are disposed at the second board.

4. The printed circuit board assembly according to claim 3, wherein the function of the washing machine comprises at least one selected from among steam, heating and drying functions.

5. The printed circuit board assembly according to claim 1, wherein the display is disposed at the third board.

6. The printed circuit board assembly according to claim 1, further comprising insulation units disposed between the first and second boards and between the first and third boards so that the first and second communication units are connected to each other and the first and third communication units are connected to each other in an insulation manner.

7. A printed circuit board assembly of a washing machine, comprising at least three boards, wherein
   the at least three boards comprise:
   a first board having a first microprocessor to control cycles of the washing machine;
   a second board having a second microprocessor to control electrical parts of the washing machine; and
   a third board having a third microprocessor to control display of the washing machine,
   the first, second and third boards are provided with first, second and third communication units, respectively, so that the first, second and third boards are separately disposed at different planes,
   the first microprocessor is connected to a power source line so that the first microprocessor is independently driven,
   the second microprocessor is driven according to a command from the first microprocessor through the first and second communication units, and
   the third microprocessor is driven according to a command from the first microprocessor through the first and third communication units.

* * * * *